(12) United States Patent
Fujikawa et al.

(10) Patent No.: US 6,285,010 B1
(45) Date of Patent: Sep. 4, 2001

(54) METHOD AND DEVICE FOR HIGH-TEMPERATURE, HIGH-PRESSURE TREATMENT OF SEMICONDUCTOR WAFER

(75) Inventors: Takao Fujikawa; Yutaka Narukawa; Tsuneharu Masuda; Makoto Kadoguchi, all of Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 0 days.

(21) Appl. No.: 09/520,218

(22) Filed: Mar. 7, 2000

(30) Foreign Application Priority Data

Mar. 26, 1999 (JP) .................................................. 11-084212

(51) Int. Cl.[7] ..................................................... A21B 1/00
(52) U.S. Cl. ......................... 219/411; 219/390; 118/724; 392/416
(58) Field of Search .................... 219/390, 405, 219/411; 392/416, 418; 118/724, 725, 715, 719

(56) References Cited

U.S. PATENT DOCUMENTS 5,167,716 * 12/1992 Boitnott et al. ........................ 118/719
5,490,228 * 2/1996 Soma et al. ........................... 392/416
5,527,561 6/1996 Dobson .
5,958,140 * 9/1999 Arami et al. .......................... 118/725
6,072,163 * 6/2000 Armstrong et al. .................. 219/497

FOREIGN PATENT DOCUMENTS 63-315527 12/1988 (JP) .
3-251183 9/1991 (JP) .
4-136820 5/1992 (JP) .

* cited by examiner

Primary Examiner—Teresa Walberg
Assistant Examiner—Shawntina J. Fuqua
(74) Attorney, Agent, or Firm—Oblon, Spivak, McClelland, Maier & Neustadt, P.C.

(57) ABSTRACT

In a high-temperature, high-pressure treatment method for semiconductor wafer for charging a wafer-like semiconductor material in a pressure vessel, forcing and pressurizing an inert gas such as argon thereto, and raising the temperature by heating by use of an electric resistance type heater, wafers are vertically stacked in the treatment chamber, and the heater is arranged within the treatment chamber to perform the treatment while supplying a heating power by DC to the heater, whereby generation of particles from the heater is suppressed.

7 Claims, 4 Drawing Sheets

METHOD AND DEVICE FOR HIGH-TEMPERATURE, HIGH-PRESSURE TREATMENT OF SEMICONDUCTOR WAFER

BACKGROUND OF THE INVENTION

1. Field of the Invention

This invention relates to a method and device for treating ULSI semiconductors represented by Si wafer under high-temperature, high-pressure atmosphere and, particularly, to a method and device for treating semiconductor wafers in a small lot of 1 to 25 pieces.

This invention further relates to a device used for a treatment of removing pores mainly by the pressure of an inert gas, such as a so-called pressure filling method for wiring film (high-pressure reflow process) of pressure treating a wafer having a copper alloy wiring film formed thereon by PVD, electrodeposition, CVD or the like by the inert gas pressure, and a method for using it, wherein the heating is performed in a short time to reduce generation of particles causing the contamination of a semiconductor substrate.

2. Description of the Related Art

As the process of treating semiconductor wafers under a high-pressure gas atmosphere by use of a vertical boat (wafer stacking jig), high-pressure oxidation process of oxidizing the surface of a Si wafer to form an insulator layer thereon is known. As the vertical device for this process, a one disclosed in Japanese Patent Application Laid-Open No. 4-234119 is known.

Since this device is entirely different in use and pressure level from the high-temperature, high-pressure treatment method using a perfectly inert gas that is intended by this invention, but similar in structure, it is shown as an example of known devices for reference.

This device is "a treatment device for semiconductor wafer comprising a pressure vessel; a hollow body having a treatment chamber within the pressure vessel, each of the pressure vessel and the hollow body having a lower opening part for receiving wafers in the movement of a plurality of wafers as one unit from the position under the pressure vessel to the position within the treatment chamber; operating means vertically movable to the pressure vessel in order to block the opening part; means connected to the hollow body in order to introduce a high-pressure oxidizer into the treatment chamber; means for introducing a pressurized inert gas into the treatment chamber; means for heating the oxidizer in the treatment chamber; means for cooling the hollow body after the treatment of the wafers in the treatment chamber; and means connected to the pressure vessel and the hollow body to equalize the pressures of the inert gas and oxidizer and connected to a body to equalize the pressures of the inert gas and oxidizer to substantially isolate the inert gas from the oxidizer". The wafers as workpiece are treated in the state housed in a vertical boat loadable of tens to a hundred and tens of pieces.

The most different point of the heating treatment of the semiconductor substrate from the treatment of other materials and members is that adhesion of dust called particles cannot be permitted.

The second different point is that extremely high productivity, or a short-time treatment is required because of the treatment within a clean room having high construction and maintenance costs.

This point is taken into consideration in the prior art and, for example, the high-pressure oxidizing device shown in FIG. 12 of Japanese Patent Application Laid-Open No. 4-234119 adapts, in order to prevent the adhesion of particles to the wafers, the structure of arranging a main heater (heating means 114) and an upper heater 124 on the outside of a bell jar 95 for housing wafers, which consists of a thin-wall inert material, for example, quartz to shield the direct inflow of the particles generated in the main heater part to the wafer side.

In FIG. 12 of Japanese patent Application Laid-Open No. 4-234119, a flat heater 125 is arranged in the lower part of the treatment chamber space formed by the bell jar in the form seen as if it is exposed to the treatment chamber, while this heater is constituted so as not to be exposed to the treatment chamber by a bottom 15 according to FIG. 21 of the same. It is consequently apparent that the heater is constituted so as not to be directly exposed to the treatment chamber at all.

In this conventional example, it is one of characteristics that the heater is made of graphite, and no ceramics is used except quartz as the insulating material in order to prevent the contamination of the wafers with heavy metals. However, inclusion of moisture or oxygen in air is actually unavoidable even in the treatment under inert gas atmosphere intended by this invention, and the use of graphite as the material of the heater is the question because of the generation of carbon dioxide ($CO_2$) or hydrocarbonaceous gas ($C_mH_n$) by the reaction of graphite with oxygen or water in electric heating and the resulting generation of sort (regarded as a kind of dust).

Another problem in such a prior art is that the rise of internal temperature of the bell jar is rather delayed to makes the precise program control of temperature to time, in contrast with the quick temperature rise of the heater part when a high-speed temperature rise is performed in temperature rising process, because the wafers as workpiece are surrounded by the bell jar and heated by the heater arranged on the outside thereof. In cooling process, also, the bell jar is the barrier to diffusion of heat to cause the problem of requiring much time for cooling.

In addition to the situation of the prior art as described above, the recent tendency of enlargement of the wafer or change in diameter from 8 in. to 12 in. is causing the possibility of changing the lot size of the semiconductor wafers to be managed in lot unit. In the present manufacturing process intended for 8-in. wafers, it is standard that 25 pieces are housed in one cassette, and in the above prior art, also, the quality management of product is performed with 25, 50 and 100 pieces, which are multiples of 25, as one lot.

When the wafer is enlarged to 12 in., it is estimated that this minimum unit is changed to a unit smaller than 25 pieces, for example, 13 pieces, and in logic semiconductors that cannot help depending on small lot multi-production, particularly, the possibility of the dominance of the production in a further smaller lot is suggested. Under such circumstances, in respect to the manufacturing device, also, a device flexibly operable according to volume with a lot as small as possible might come to the force as the form of the device in future with high probability.

Accordingly, even in the batch type device as shown as the prior art, a one treatable in a small lot is increasingly required. On the other hand, the oxidation treatment shown as one example of the prior art has many subjects such as necessity of a long time even in a small lot, because formation of the oxide film by oxidizing phenomenon depends on time.

Such a treatment with little limitation on treatment time can be constructed with a process of treating a small lot in a short time so as not to lose the productivity. It is known that such a limitation on time is lessened in the treatment with a high-temperature, high-pressure gas represented by the pressure filling of metal wiring film.

Accordingly, this treatment is conformable to a demand of treating such a small lot in a short time offsetting it. In this case, it is a great subject that what small lot can be treated with a device as small as possible. Namely, it is important that how the maximum number of wafers are treated with a device having a small treatment capacity.

In any case, it is difficult to suppress the generation of particles from the electric furnace part in a vertical furnace for performing the treatment in batch, including a one using a high-pressure gas shown in the prior art, and it is common practice to house the semiconductor wafers as workpiece in the bell jar consisting of an airtight material.

On the other hand, in this bell-jar structure, the delay of temperature rise in the processing chamber space on the inside of the bell jar to the supply of heat by the heater part arranged on the outside of the bell jar makes the precise control of temperature difficult and also leads to the increase in diameter of the heater, resulting in the enlargement of the whole device.

SUMMARY OF THE INVENTION

This invention is based on such actual circumstances, and it has an object to suppress the generation of particles from the heater. This invention took the following technical means in order to attain the above object.

Namely, this invention provides a high-temperature, high-pressure treatment method for semiconductor wafer, especially for charging a wafer-like semiconductor material in a treatment chamber within a pressure vessel, forcing and pressurizing an inert gas such as argon thereto, and raising the temperature by heating by use of an electric resistance type heater, which is characterized by vertically stacking wafers in the treatment chamber, arranging the heater within the treatment chamber, and performing the treatment while supplying a heating power by DC to the heater.

In this invention, DC is carried to the heater to supply the heating energy as described above. Conventionally, the industrially used electric furnaces, including those for semiconductor, mostly adapt the AC heating by a power control system using a thyristor. When AC is used for heating, heater elements are mutually attracted or repelled by the magnetic force generated by the current carried to the respective elements between the adjacent heater elements, or the Lorentz force is generated.

Since AC of 60 Hz or 50 Hz is generally used for heating, the Lorentz force causes a vibration synchronous thereto to produce a hum. The heater element is rubbed with a member making contact therewith by this vibration to generate particles or scatter the powder particles adhered to the element or generated by oxidation.

In order to prevent the generation of such a vibration, in this invention, DC is carried to the heater element to perform the heating. Since the particle generation can be eliminated by this prevention of vibration even if the heater and the semiconductor wares are coexistent in the treatment chamber, the semiconductors can be prevented from being contaminated with the particles resulted from the heater.

In this invention, a temperature measuring means for measuring the treatment chamber internal temperature is preferably provided within the treatment chamber to control the feed current to the heater on the basis of the temperature measured by the temperature measuring means.

Further, this invention provides a high-temperature, high-pressure treatment device for semiconductor wafer for charging a wafer-like semiconductor material in a treatment chamber within a pressure vessel, forcing and pressurizing an inert gas such as argon thereto, and raising the temperature by heating by use of an electric resistance type heater, which is characterized by arranging the heater within the treatment chamber and providing a power source for supplying a heating current by DC to the heater.

Such a device is preferably provided with a temperature measuring means for measuring the treatment chamber internal temperature within the treatment chamber and a control means for controlling the feed current to the heater on the basis of the temperature measured by the temperature measuring means.

As the material of the heater, iron-base oxidation resistant alloy, platinum, or high-melting point metal such as tungsten, tantalum, molybdenum or the like is preferably used.

The treatment chamber of the device is necessarily exposed to the atmosphere when the semiconductor wafers are taken in and out. Therefore, the treatment chamber is generally evacuated and substituted by an inert gas after closing the lid of high pressure vessel, and then transferred to general heating process. At this time, although inclusion of a trace amount of atmosphere is unavoidable, a material hardly causing oxidation or nitration with this trace atmosphere is used, whereby generation of particles resulted from the resulting oxide can be prevented.

The temperature measuring means is formed of a thermocouple, at least the part to be inserted into the treatment chamber of a heat conductive element wire is housed in a protecting tube, and the material of the protecting tube preferably consists of iron-base oxidation resistant alloy, platinum, or high-melting point metal such as tungsten, tantalum, molybdenum or the like.

Further, the heater is formed of a plurality of heater elements, the temperature measuring means is provided in conformation to each heater element, and the control means is preferably constituted so as to be independently controllable of each heater element.

In this case, the heating power value can be controlled so that the temperature of each prescribed temperature measuring means has a prescribed temperature distribution or is soaked.

PREFERRED EMBODIMENT OF THE INVENTION

A preferred embodiment of this invention is further illustrated on the basis of the accompanying drawings.

Figure 1:
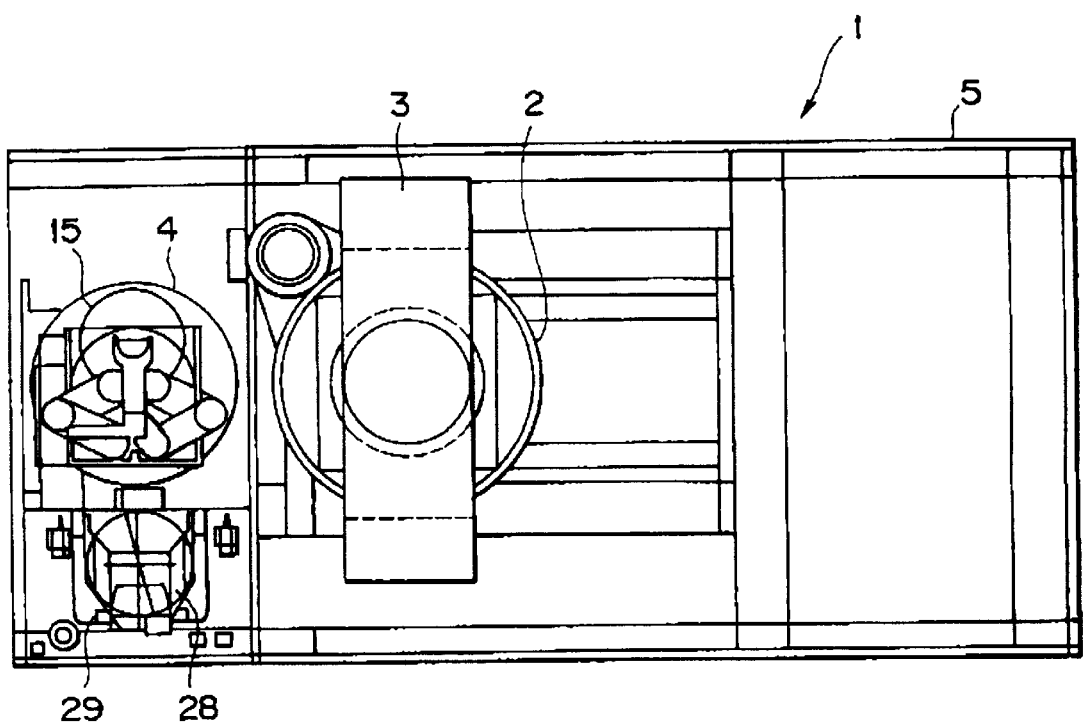
FIG. 1 is a plan view of a treatment device according to this invention.
Figure 2:
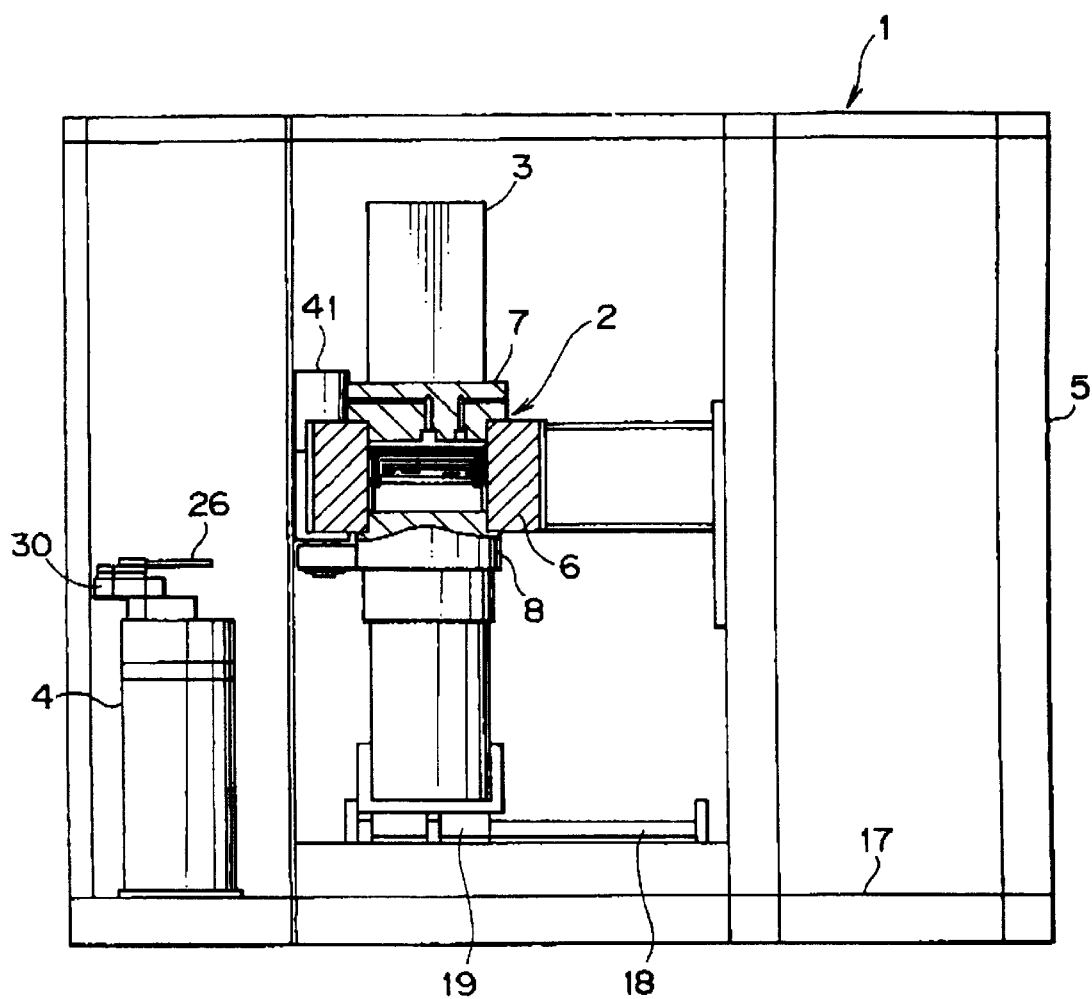
FIG. 2 is a front view of FIG. 1.

FIGS. 1 and 2 are an example of the body part of a semiconductor high-temperature, high-pressure treatment device 1 according to this invention, which particularly shows the operating state at a high pressure with a high-pressure gas charged in a high-pressure vessel (pressure vessel) 2.

The body part is formed of the high-pressure vessel 2 including a press frame 3, a wafer transfer robot (transfer means) 4, and a casing 5 for housing the whole of them.

Figure 3:
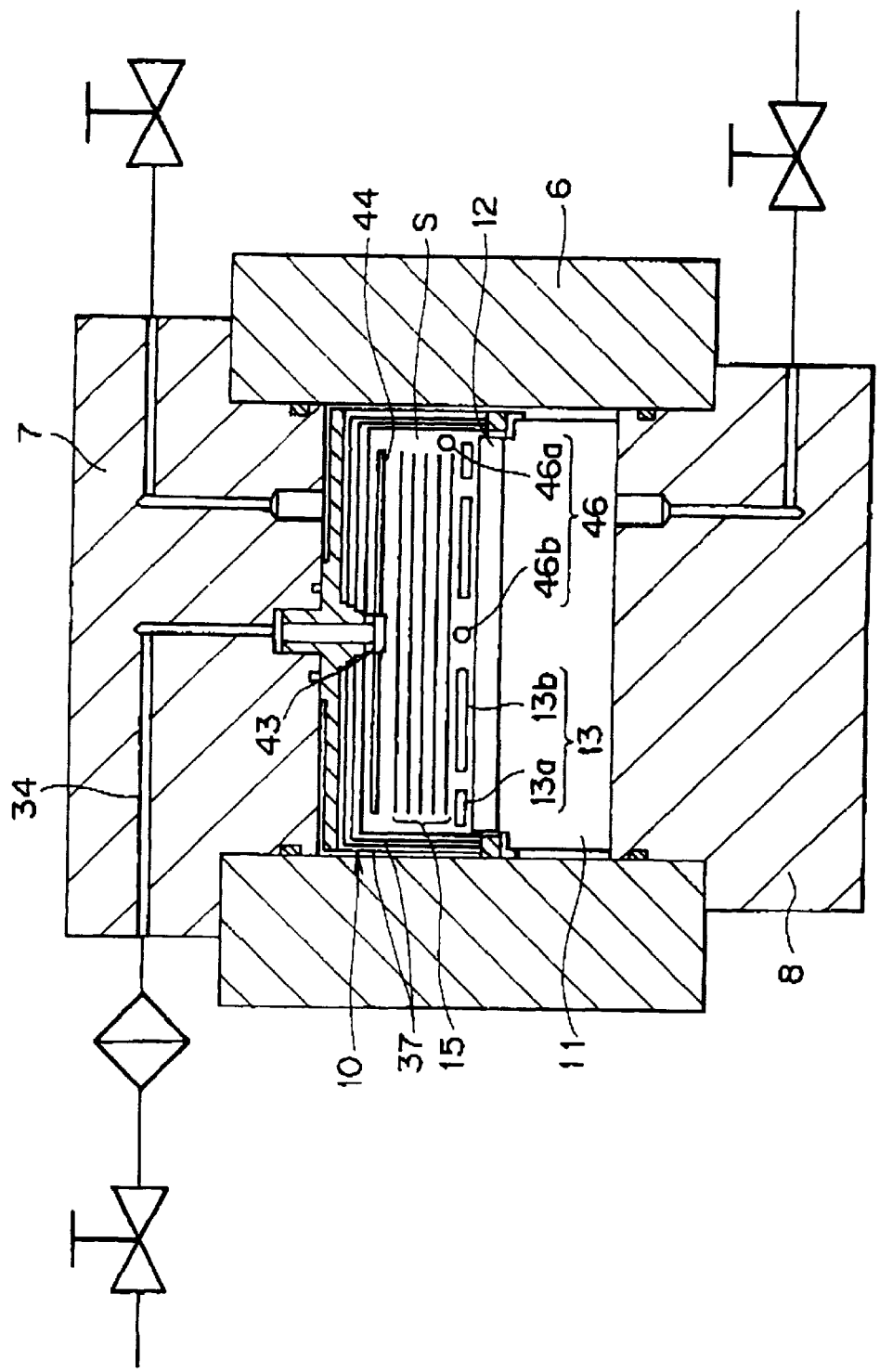
FIG. 3 is an internal cross sectional view of a high-pressure vessel.

As shown in FIG. 3, the high-pressure vessel 2 is formed of a high-pressure cylinder 6, an upper lid 7, a lower lid 8, and the press frame 3 for supporting the axial load acting on the upper and lower lid 7, 8. A heat insulating structure 10 is integrated into the space S formed by the upper lid 7 and the cylindrical part 6, and a heater 13 divided into two radially inner and outer zones (heater elements 13a, 13b) is arranged on an insulating material 12 through a metallic shield block 11 containing a heat insulating plate and an electrode such as heater on the lower lid 8. Namely, the heater 13 is situated within the treatment chamber S and provided so as to situate under wafers 15 set above the lower lid 8. The heater 13 is of electric resistance wire heating system.

When the heater 13 is provided on the lower lid 8, another member may be interposed between it and the lower lid 8 as described above, or directly provided.

When the semiconductor wafers 15 as workpiece are taken out from and in the high-pressure vessel 2, the press frame 3 is moved sideward on a rail 18 set on a base frame 17 by a slide block 19 fixed to the lower end of the press frame 3, and the lower lid 8 is then lowered under by a lower lid rising and falling actuator 41.

The semiconductor wafers 15 are held by extending the robot hand 26 of a wafer handling robot 4 set on the opposite side to the moving direction of the press frame 3 in the upper surface direction of the lower lid 8 to hold the exposed wafer 15 from under, and recovered by driving the robot 4 to transfer them to a wafer cassette 28 placed on a wafer elevator 29. The mounting of the wafers 15 on the device 1 is performed according to the reverse procedure.

In the wafer handling robot 4 shown in FIGS. 1 and 2, the arm 30 of the robot 4 is horizontally rotatable and expansible, and vertically movable. When the wafer cassette 28 is set on the cassette elevator 29, the vertical movement of the robot arm 30 is only the operation of scooping the wafers from the cassette or lowering them, and a moving distance of several mm is sufficient for this. When the cassette elevator is not used, a robot 4 having a vertical moving distance conformable to the taking-out and -in of the wafers 15 from the cassette 28 is used.

A robot hand 26 is provided at the tip of the arm 30, and it is formed of a forked metal plate such as aluminum or ceramic plate such as alumina. The wafers are lifted up as scooped by this hand part 26, and transferred.

FIG. 3 shows an enlarged view of the body part of the device 1. A water-cooled jacket 32 for discharging the heat supplied from the internal heater 13 out of the system to hold the temperature of the high-pressure vessel at room temperature to a hundred and tens ° C. is mounted on the high-pressure cylindrical part 6 of the high-pressure vessel 2. It is also recommended to form a wafer-cooling groove on the upper lid 7 (not shown) because a good deal of heat is accumulated in the high-pressure vessel upper lid 7 from the same reason. The high-pressure vessel upper lid 7 has a high-pressure gas inlet port 34 and a high-pressure gas discharge port 35 provided independently therefrom.

A heat insulating structure 10 formed of several metallic cup-like members 37 superposed with a space (described in more detail later).

The heater 13 for heating the semiconductor wafers 15, a wafer support jig for supporting the wafers 15 in shelf plate form, and the like are arranged on the lower lid 8 (on the insulating material) as described above, and the metallic shield block 11 for suppressing the heat conduction to the lower lid 8 and housing a connecting electrode and the like is arranged between the lower lid 8 and the space having the members 13, 39 arranged therein.

The semiconductor wafers are placed in a position never interfering with the hand 26 of the robot 4 coming in and out from the left in FIG. 3 on a wafer support of the form of supporting 1 to 25 pieces (5 pieces in FIG. 3) on three to four circumferential points thereof. In the example of FIG. 3, the number of the wafers 15 to be loaded is five, and much more pieces can be stacked when a sufficient soaking area determined depending on the temperature and pressure and the arrangement of the heater 13 can be vertically ensured.

As the heat insulating structure 10, it is recommended to use a one formed by superposing metallic bottomed cylinders (cup-like members) 37 in a plurality of layers upside down as shown in FIG. 3 without using a blanket heat insulating material consisting of a fibrous inorganic matter used in most of the conventional semiconductor vertical electric furnaces.

The fibrous heat insulating material has the effect of suppressing the natural convection of the gas in the electric furnace and also suppressing the radiation with excellent heat insulating effect, and the use of this allows the effective suppression of radiation even in a high-pressure gas atmosphere.

However, the fibrous inorganic is ruptured by repeated temperature rise and drop to generate fine powder-dusts or particles. Accordingly, the use of the bell jar is indispensable in order to isolate the space where the heat insulating material is arranged from the space where the semiconductor wafers are arranged.

In this invention, the superposed structure of the metal bottomed cylinders 37 as the heat insulating structure 10 is adapted without using the fibrous inorganic, whereby generation of particles can be suppressed although the heat insulating function is slightly deteriorated.

In many vertical furnaces, the heater element (element) is frequently fixed to the fibrous inorganic blanket in the form as exposed to the treatment chamber side.

In this invention, the self-standing form or the form fixed to a fixing support through an electric insulator 12 consisting of ceramics or quartz is recommended for the heater element 13. Particularly, the heater element 13 is set so as to make point contact with the insulator 12, whereby the rubbing of the heater element 13 with the insulator 12 by the thermal expansion difference between the both can be reduced.

With respect to the heat insulating structure 10, it is effective to set the space between the metallic bottomed cylinders 37 to about 0.5–3 mm when argon gas is used as the pressure medium gas, and from the viewpoint of suppressing also the radiation, superposition of three layers or more is effective. The example of FIG. 3 takes 4-layer structure. The larger the number of layers is, the more the suppressing effect of natural convection and radiation can be enhanced. However, when the space is reduced, the problem of generation of dust (particles) arises since the metal cup-like members 37 are mutually rubbed by the thermal expansion difference.

From such a viewpoint, it is practical to superpose the cup-like members 37 of 0.5–2 mm thick in 3 to 6 layers when the internal temperature is about 300–500° C. The heat insulating structure 10 is fixed, for example, by screwing it to the vessel inside opening part of the high-pressure gas inlet port 34 provided on the upper lid 7.

Gas diffusion ports 43 are provided in 3 to 6 circumferential points. From the viewpoint of preventing the gas diffusion and the turbulence of temperature, it is also recommended to arrange a gas diffusion plate 44 as shown in the drawing. Thickness-directional holes are provided on this gas diffusion plate 44, whereby the flow of gas can also be intentionally regulated.

This invention is characterized by supplying a heating energy by DC to the heater 13 by use of an electric furnace heater formed of the thus-constituted heat insulating structure 10 and heater 13. The supply of not AC but DC allows the prevention of generation of vibration, resulting in no generation of particles even if the heater 13 and the semiconductor wafer 15 are coexistent within the treatment chamber S formed by the inner surface of the heat insulating structure 10. Accordingly, the semiconductor wafers 15 can be prevented from being contaminated with the particles resulted from the heater 13 or the heat insulating material.

It is recommended to divide the heater 13 arranged substantially in disc form on the lower lid 8 into a plurality of inner and outer zones as shown in the drawing so as to be independently controllable of the input heat. Namely, a plurality of ring-like heater elements 13a, 13b are preferably concentrically arranged.

This reason is that the use of one heater cannot avoid the temperature distribution in the wafer 15 that the temperature is high in the center and low in the outer part caused by the radiation resulted from the natural convection of gas, and this distribution is changed depending on pressure or temperature condition.

Figure 4:
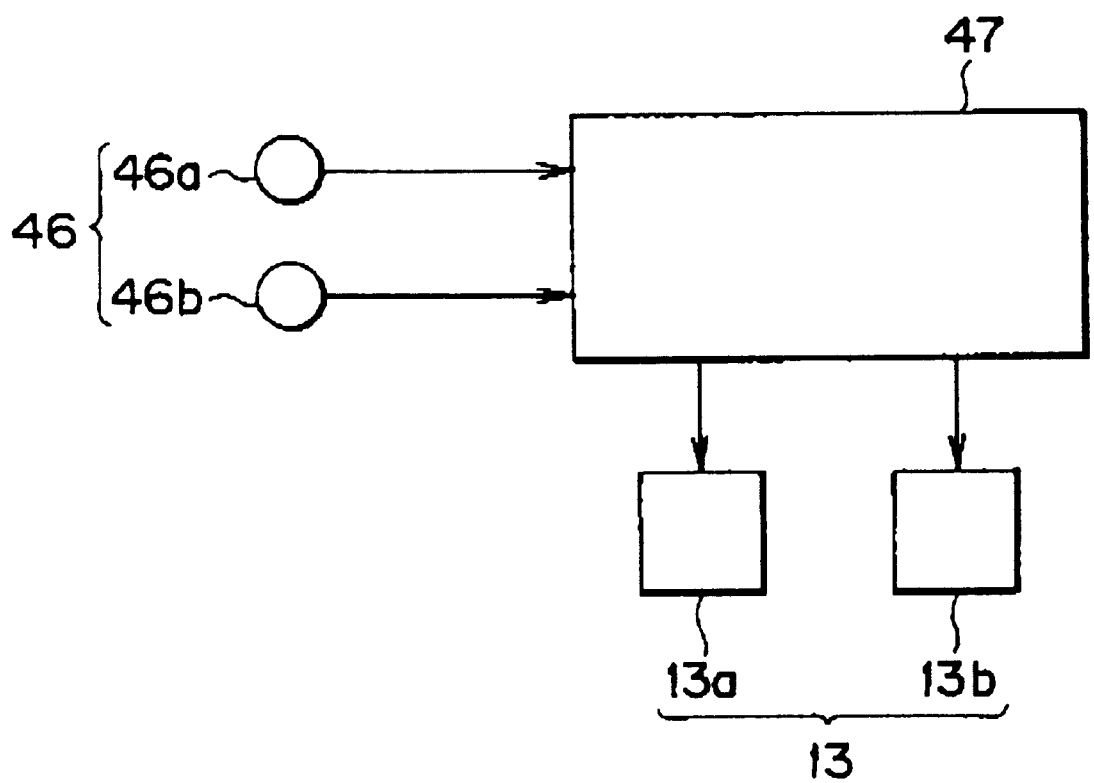
FIG. 4 is a block view of a temperature control device within a treatment chamber.

In order to solve this problem, the heater 13 is divided into a plurality of zones, and temperature measuring means 46 corresponding to the number of zones are provided to successively feed back the measured temperature corresponding to each zone to the heating power control device (control means) 47 as shown in FIG. 4. The control device controls the value of the DC to be supplied to the heater 13 according to the feedback quantity. According to this, the soaking between the inside and outside can be ensured.

The device according to this preferred embodiment is provided with the ring-like outer heater 13a, the ring-like inner heater 13b arranged concentrically on the radial inside of the outer heater 13a as the heater 13, an outer temperature measuring means 46a provided near the outer heater 13a, and an inner temperature measuring means 46b provided near the inner heater 13b.

As the material of the heater element material, oxidation resistant alloy, platinum or high-melting point metal such as tungsten or tantalum is used. The treatment chamber of the device is necessarily exposed to the atmosphere when the semiconductor wafers 15 are taken in and out. After the opening and closing of the device, it is evacuated and substituted by inert gas, and then transferred to general heating process. At this time, inclusion of a trace amount of atmosphere is unavoidable. Therefore, a material hardly causing oxidation or nitration with the trace atmosphere is used, whereby the generation of particles caused by the resulting oxide can be prevented.

When an iron-base oxidation resistant alloy such as stainless steel or high chromium alloy, or platinum is used as the heater element material, it is practical to take the form of fixing the heater element 13 through the ceramic insulator 12, since its heat insulating resistance is not very high. In this case, it is recommended to minimize the contact area of the heater element material with the insulator 12 as much as possible, so that the generation of particles by the rubbing by the thermal expansion difference between the both in temperature raising and lowering process can be minimized.

When a high-melting point metal such as tungsten is used as the heater element 13, the self-standing structure can also be adapted because of its high strength at high temperature. In this case, the generation of particles by the rubbing with the insulator 12 can be avoided since the use of the electric insulator is not required for the high-temperature part.

As the temperature measuring means 46, a thermocouple is generally used, and the insulation between the plus-element wire and minus element wire thereof is performed by use of a ceramic insulating tube. The temperature measuring contact part where the plus-element wire is welded to the minus-element wire is laid in exposed state, whereby the responsiveness can be enhanced.

On the other hand, the occurrence of temperature measurement error by the contamination of the temperature measuring contact with the atmospheric gas can be suppressed by housing it in a sheath-like tube consisting of a material coincident or similar to the heater element 13. In this case, the responsiveness cannot help being sacrificed to some degree.

Accordingly, it is recommended to set the temperature measuring contact so as to be exposed to the treatment chamber space when a high-speed temperature rise is necessary and to use the sheath when the temperature is raised at a relatively gentle speed.

The high-temperature, high-pressure gas atmosphere has the characteristic of hardly causing the temperature distribution within horizontal plane, because the high-pressure gas is apt to cause natural convection with high density and low viscosity under this atmosphere, and the difference in density by temperature is also large. When two stages of upper and lower heaters are arranged by wisely using this characteristic, the temperature measuring means for controlling the power of the upper heater mainly charging the heating of the semiconductor wafer arranged in the upper part is arranged not just close to the heater but on one side of the semiconductor wafer in the upper part, whereby the control can be preformed at a temperature closer to the temperature of the workpiece.

As is apparent from the above, according to this invention, the environment around semiconductor wafers can be made to a clean atmosphere free from particles without using the conventionally used bell jar, and the dimension of the device can be minimized because the bell jar is not used.

Since the temperature measuring means can measure the temperature just near the semiconductor wafers as workpiece and feed back it to the heating power control system by being provided within the same treatment chamber together with the heater, the temperature rise at high speed can be precisely controlled.

Thus, in a treatment by use of high-pressure inert gas such as pressure filling treatment of wiring film to whose effectiveness attention is being paid in accordance with the recent finer working of ULSI, prevention of contamination of semiconductor wafers by particles, finer integration of device, and high-speed temperature rise by precise temperature control, which are serious subjects therein, can be realized. Accordingly, problems possessed by the high-temperature, high-pressure gas treatment device such as larger size, heavier weight and long treatment time, which make the set within an expensive clean room difficult, can be solved, and this invention can be expected to significantly contribute to the improvement in productivity and reduction in cost which will be increasingly made important.

What is claimed is:

1. A high-temperature, high-pressure treatment method for semiconductor wafers, comprising the steps of:
   vertically stacking wafers in a treatment chamber within a pressure vessel;
   forcing and pressurizing an inert gas such as argon into the treatment chamber, and raising the temperature in the treatment chamber by using an electric resistance heater located within the treatment chamber to perform the treatment while supplying DC heating power to the heater.

2. A high-temperature, high-pressure treatment method for semiconductor wafer according to claim 1 wherein a temperature measuring device for measuring the internal temperature of the treatment chamber is provided within the treatment chamber, and the feed current to the heater is controlled on the basis of the temperature measured by the temperature measuring device.

3. A high-temperature, high-pressure treatment device for semiconductor wafers, comprising:
   a charging device adapted for charging a wafer-like semiconductor material in a treatment chamber within a pressure vessel,
   an inert gas supplying device adapted for forcing and pressurizing an inert gas such as argon into the treatment chamber
   a heater adapted for raising the temperature in the treatment chamber, the heater comprising an electric resistance heater located within the treatment chamber; and
   a power device adopted for supplying DC heating power to the heater.

4. A high-temperature, high-pressure treatment method for semiconductor wafer according to claim 3 wherein a temperature measuring device for measuring the internal temperature of the treatment chamber is provided within the treatment chamber, and a control means for controlling the feed current to the heater on the basis of the temperature measured by the temperature measuring device is provided.

5. A high-temperature, high-pressure treatment device for semiconductor wafer according to claim 3 wherein the material of the heater is iron-base oxidation resistant alloy, platinum, or high-melting point metal such as tungsten, tantalum, molybdenum or the like.

6. A high-temperature, high-pressure treatment device for semiconductor wafer according to claim 4 wherein the temperature measuring device consists of a thermocouple, at least the partial thermocouple element wire to be inserted into the treatment chamber thereof is housed in a protecting tube, and the material of the protecting tube is iron-base oxidation resistant alloy, platinum or high-melting point metal such as tungsten, tantalum, molybdenum or the like.

7. A high-temperature, high-pressure treatment device for semiconductor wafer according to claim 3 wherein the heater is formed of a plurality of heater elements, the temperature measuring device is provided in conformation to each heater element, and the control means is constituted in such a manner as to independently control each heater element.

* * * * *